United States Patent [19]

Partin

[11] Patent Number: 4,577,322
[45] Date of Patent: Mar. 18, 1986

[54] LEAD-YTTERBIUM-TIN TELLURIDE HETEROJUNCTION SEMICONDUCTOR LASER

[75] Inventor: Dale L. Partin, Sterling Heights, Mich.

[73] Assignee: General Motors Corporation, Detroit, Mich.

[21] Appl. No.: 543,368

[22] Filed: Oct. 19, 1983

[51] Int. Cl.$^4$ .................. H01S 3/19; H01L 33/00
[52] U.S. Cl. ............................... 372/44; 357/16; 357/17; 357/61; 372/45
[58] Field of Search ............ 372/44, 45; 357/16, 357/17, 61

[56] References Cited

U.S. PATENT DOCUMENTS

| | | | |
|---|---|---|---|
| 2,978,661 | 4/1961 | Miller et al. | 338/22 |
| 3,311,510 | 3/1967 | Mandelkorn | 148/1.5 |
| 3,370,942 | 2/1968 | Inoue | 75/134 |
| 3,371,041 | 2/1968 | Hotlzberg et al. | 252/62.51 |
| 3,371,042 | 2/1968 | McGuire et al. | 252/62.51 |
| 3,409,554 | 11/1968 | Mandelkorn | 252/62.3 |
| 3,544,865 | 12/1970 | Holtzberg et al. | 317/237 |
| 3,574,676 | 4/1971 | Gambino et al. | 117/201 |
| 3,818,328 | 6/1974 | Zinn | 324/43 R |
| 4,350,990 | 9/1982 | Lo | 357/16 |

OTHER PUBLICATIONS

E. Kaldis and W. Peterler, Iswestia po-Chimia, Bulgaria Academy of Sciences, 11, No. 3/4, 431 (1978).
C. Paparoditis and R. Suryanarayanan, J. Cryst, Growth 13/14, 389 (1972).
R. Suryanarayanan and C. Paparoditis, Les Elements des Terres Rares, Colloq. Intern. C.N.R.S., Grenoble, No. 180, p. 149 (1969).
S. Rotter, D. Kasemset, and C. G. Fonstad, IEE Electron Device Letters, EDL-3, 66 (1982).
D. Kasemset, S. Rotter, and C. G. Fonstad, J. Electronic Materials, 10. 863 (1981).
D. Kasemset and C. G. Fonstad, Appl. Phys. Letters, 39(11), 872 (1981).

Primary Examiner—James W. Davie
Assistant Examiner—Georgia Y. Epps
Attorney, Agent, or Firm—Robert J. Wallace

[57] ABSTRACT

A double heterojunction lead salt diode infrared laser having an active region of a lead salt semiconductor of a given lattice constant, energy band gap, and index of refraction. The active region is sandwiched between two lead salt semiconductor layers containing ytterbium that are mutually of opposite conductivity type and have substantially the same lattice constant as the active layer. In addition, the ytterbium-containing lead salt layers have an energy band gap greater than the active layer and an index of refraction less than the active layer. Hence, the laser has lattice matching, as well as enhanced, carrier confinement and optical confinement.

4 Claims, 1 Drawing Figure

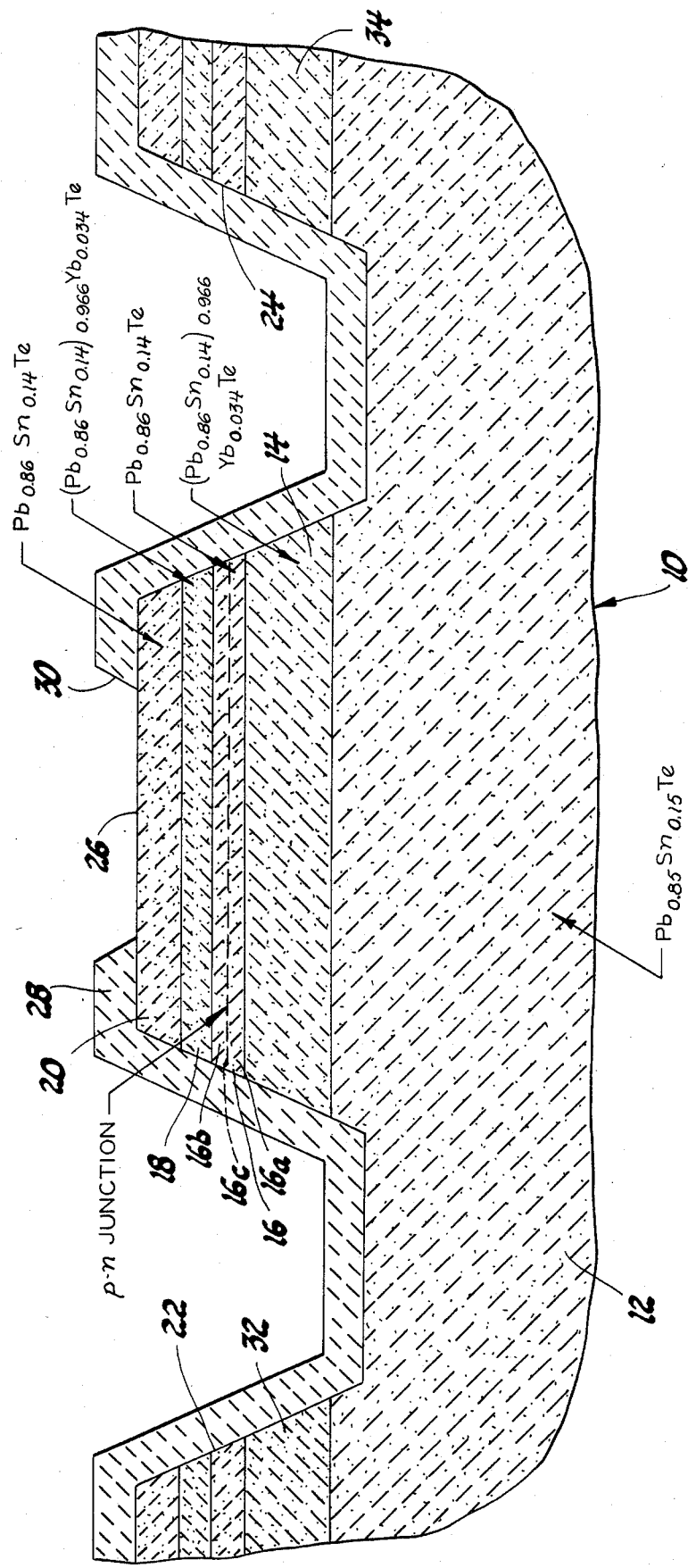

LEAD-YTTERBIUM-TIN TELLURIDE HETEROJUNCTION SEMICONDUCTOR LASER

FIELD OF THE INVENTION

This invention relates to an improved double heterojunction lead salt diode infrared laser. It more particularly involves long wavelength infrared lasers having an active layer of a lead-tin salt sandwiched between two lattice-matched lead-tin-ytterbium salt semiconductor lasers.

BACKGROUND OF THE INVENTION

A semiconductor diode laser is a monocrystalline pn junction device. In one form of such a device, the pn junction is in a plane disposed in an active region between two parallel rectangular faces of a monocrystalline semiconductor body. Two mutually parallel reflective faces that are perpendicular to the pn junction form a laser cavity. Lasing action is produced by applying a forward voltage across the pn junction. The forward bias injects electrons and holes across the pn junction. Electrons and holes recombine in the active region to cause stimulated emission of the radiation. Above a given level of electron injection, called the threshold current ($I_{TH}$), emitted radiation is collected and amplified in the active region. The amplified radiation exits the active region parallel the pn junction as a monochromatic beam.

Electrons can be injected into the active region without stimulating emission therein. For example, they can escape outside the active region to adjacent portions of the semiconductor body, where they recombine without contributing to laser emission. Analogously, photons produced in the active region can escape from the active region by radiation in a direction not parallel the pn junction. In addition, it is possible for electrons to disappear within the active region without producing the desired emission of radiation, such as by combining with holes at crystal defects. All such losses reduce laser efficiency, i.e. output power. One can restrict escape of injected electrons and holes and stimulated photons from the active region by sandwiching the active region between two layers of monocrystalline semiconductive material having a larger energy band gap and a lower index of refraction than the active region. On the other hand, the active region, and as a practical matter the two adjacent layers must be a very high monocrystalline quality. This requires that these layers and the active region be closely matched not only in crystal structure but also in crystal lattice size. Moreover, one of the sandwiching layers must be doped to n-type conductivity and the other to p-type conductivity. Such a structure is referred to herein as a double heterojunction semiconductor diode laser.

Highly efficient double heterojunction long wavelength semiconductor lasers have heretofore been difficult to make. By long wavelength I mean longer than about 7 micrometers. I have found a material which permits one to make such a laser easily.

OBJECTS AND SUMMARY OF THE INVENTION

It is therefore a principal object of this invention to provide an improved lead salt semiconductor diode laser.

Another object of the invention is to provide an improved lead-tin telluride heterojunction diode infrared laser.

The invention comprehends a double heterojunction lead salt diode infrared laser having a lead-tin telluride active region layer. The active region layer is sandwiched between an upper n-type confinement layer and a lower p-type buffer layer, both of which are lead-tin-ytterbium telluride layers. The lead-tin-ytterbium telluride confinement and buffer layers have a larger energy band gap than that of the active region layer and a lower index of refraction. However, both the confinement layer and the buffer layer have an identical crystal structure to that of the active region layer and substantially the same lattice constant. In a preferred example, all three layers are epitaxially grown on a high quality lead-tin telluride substrate of substantially the same lattice constant. Also, a lattice-matched epitaxial layer of lead-tin telluride is preferably disposed on the confinement layer, to aid in making a low resistance electrical contact on that face.

BRIEF DESCRIPTION OF THE DRAWING

Other objects, features and advantages of the invention will become more apparent from the following description of preferred embodiments thereof and from the drawing, which shows a sectional view of a lead salt semiconductor diode laser made in accordance with this invention.

DESCRIPTION OF THE PREFERRED EMBODIMENTS

In substance, this invention recognizes that the inclusion of ytterbium in a lead-tin telluride composition can significantly increase the energy band gap without also significantly changing the crystal lattice constant. Moreover, this invention recognizes that even though appreciable proportions of lead and/or tin are replaced by ytterbium, the resultant semiconductor can still be doped to p-type conductivity. I also recognize that index of refraction decreases with increasing ytterbium content. I have further recognized that such a material is useful in making a double heterojunction lead salt diode infrared laser such as shown in the drawing.

The drawing illustrates a semiconductor diode laser 10 made on a 0.5 millimeter thick monocrystalline $Pb_{0.85}Sn_{0.15}Te$ substrate 12. Substrate 12 has a p-type doping of about $5 \times 10^{18}$ atoms per cubic centimeter. As is normal for such compositions, the crystal structure is face centered cubic and the lattice constant is about 6.44 angstroms. The drawing shows a cross-sectional fragment of substrate 12. The fragment contains an entire cross section of a central mesa portion and a portion of a cross section of a mesa on each side of the central mesa. The central mesa contains a laser cavity and is as hereinafter described. The presence of the side mesas 32 and 34 are incidental to the laser manufacturing process, and are no more important to this invention than they are to any other semiconductor diode laser.

The structure in the drawing is made by epitaxially depositing a blanket semiconductive layer 14 of $(Pb_{0.86}Sn_{0.14})_{0.966}Yb_{0.034}Te$ on substrate 12. It can be seen that semiconductive lead salt layer 14 differs from the lead salt substrate principally in that it contains ytterbium. It is of p-type conductivity, having a p-type dopant concentration of approximately $1 \times 10^{19}$ atoms per cubic centimeter. The interface between these layers presents no significant electrical resistance. The ytterbium-containing lead salt layer 14 is chiefly a confinement layer, and as such should be at least about 1-2 micrometers thick. However, it also serves as a buffer layer. To serve the latter purpose as well, it is grown to a thickness of about 5 microns. By buffer layer I mean that layer 14 is grown to a sufficient thickness to at least partially mask crystal imperfections that may arise at its interface with the substrate 12. Such a thickness and purpose is not new, nor more critical to this invention than any other lead salt laser. In any event, a thickness of at least about 3 microns is generally needed to perform the buffering function. Generally, there is not much improvement in the buffering function with thicknesses above 6 microns. Even though semiconductive layer 14 contains 3.4 mole percent ytterbium, presumably as ytterbium telluride, it still is monocrystalline and has a face centered cubic crystal structure with a lattice constant of about 6.44 angstroms.

A blanket epitaxial layer 16 of p-type $Pb_{0.86}Sn_{0.14}Te$ semiconductive material is then grown on top of the ytterbium-containing semiconductive layer 14. It is monocrystalline and of face centered cubic crystal structure, having a lattice constant of about 6.44 angstroms. The lower portion 16a of layer 16 is doped to p-type conductivity of about $3 \times 10^{18}$ atoms per cubic centimeter. The upper portion 16b of layer 16 is doped to n-type conductivity, having an n-type impurity concentration of about $2 \times 10^{18}$ atoms per cubic centimeter. The interface between the layer upper portion 16b and the layer lower portion 16a is a pn junction 16c. Layer 16 thus comprises the laser active region. For ease of identification of this layer as compared to the other layers, I refer to this entire layer 16 as the active region layer.

A blanket epitaxial layer 18 of n-type $(Pb_{0.86}Sn_{0.14})_{0.966}Yb_{0.034}Te$ is then disposed on the upper surface of the active layer 16. This is a second, or upper, ytterbium-containing lead salt layer 18 that is identical in composition and properties to the lower ytterbium-containing lead salt layer 14, except for a difference in doping. The upper ytterbium-containing lead salt semiconductor layer 18 is doped to n-type conductivity by containing an n-type impurity concentration of about $2 \times 10^{18}$ to $1 \times 10^{19}$ atoms per cubic centimeter. Like the lower ytterbium-containing lead salt semiconductor layer 14, the upper ytterbium-containing lead salt semiconductor layer 18 has a face centered cubic crystal lattice having a lattice constant of about 6.44 angstroms. Both of layers 14 and 18 have an index of refraction that is less than the index of refraction of the active region layer 16. The thickness of layer 16, and its portions 16a and 16b, are the same in this invention as in other semiconductor diode layers. I prefer that the active region layer 16 and the confinement layer 18 each be about 1-2 micrometers thick.

As with any other heterojunction semiconductor diode lasers, layer 18 should have a thickness of at least about 0.1 micrometer in order to efficiently confine electrons and holes. I doubt that there is much benefit in having the confinement layer 18 be appreciably thicker than about 3 micrometers. In fact, if it is too thick, it will impede heat flow away from the pn junction 16c. It should be remembered, of course, that lead-salt semiconductors are not particularly heat conductive. One ordinarily wishes to have junction 16c be as close to the upper surface 26 of the device as is practical, because a heat sink (not shown) is affixed to that surface.

In addition, in order to insure that a durable, low resistance ohmic contact can be obtained on the upper surface of the device, a final upper layer 20 is epitaxially deposited onto the upper confinement layer 18. The upper layer 20 is of a lead-salt having the composition $Pb_{0.86}Sn_{0.14}Te$. It is a monocrystalline layer of the same tin and lead proportions as in the underlying layers. Hence, it has the same face centered cubic crystal structure and lattice constant of 6.44 angstroms. However, it is doped p-type conductivity by having a p-type impurity concentration of about $1 \times 10^{19}$ atoms per cubic centimeter.

Layer 20 has a thickness of about 1-2 micrometers. If this layer 20 is to be used at all, it should have a thickness at least large enough to provide a continuous coating, but not so thick as to provide a significant thermal resistance between the pn junction 16c and the upper surface of the laser, where heat is ordinarily withdrawn to coat the laser. Accordingly, I would not want the layer 20 to be appreciably more than about 2 micrometers.

Ordinarily, a laser such as shown in the drawing is fabricated by initially blanket depositing its various layers onto a substrate and then surface etching the resultant product to define the lasing mesa, i.e. the central mesa in the drawing. I contemplate making my laser similarly. For example, after layers 14, 16, 18 and 20 are epitaxially deposited, parallel grooves 22 and 24 are etched into the upper surfaces 26 of the wafer, down through all of the layers and into the surface of the substrate 12. The length, width and depth of the grooves, as well as their side wall angle with surface 26, are no more material to this invention than they are to any other double heterojunction semiconductor infrared diode laser. For purposes of providing a specific example, they should be wide enough apart to provide a width on upper surface 26 of the central mesa of about 5-40 micrometers, preferably 25 micrometers. The length of upper surface 26 should be about 150-600 micrometers, preferably 400 micrometers. The width of grooves 22 and 24 is not especially critical either. Then the entire upper surface 26 is anodized, including the surfaces within the grooves 22 and 24, to form a native oxide coating 28.

A rectangular contact window 30, extending substantially along the entire length of the upper surface 26, is opened by photoetching techniques, so that a low resistance ohmic contact can be made along the entire upper surface 26 of the upper layer 20. The coated substrate is then cut along the side mesas 32 and 34 to provide an elongated body having a central mesa for lasing. The ends of the substrate 12 are then cleaved in the normal and accepted manner, to provide a device having a laser cavity. Low resistance electrical contacts can be made to surface 26, and to the backside (not shown) of substrate 12 in the same manner previously described in Wayne Lo's U.S. Pat. No. 4,350,990, which is entitled "Electrode for Lead-Salt Diodes" and which is incorporated herein by reference.

Dopants used in the substrate 12 and the various layers 14, 16, 18 and 20 can be the same as those conventionally used in making any lead salt semiconductor diode laser. As for example, one can dope to n-type conductivity by using an excess of lead in the semiconductor composition or by including appropriate quantities of bismuth, copper or cadmium ions in the layer. They can be included as grown, by ion implantation, or by diffusion. Analogously, p-type doping can be by an excess of tellurium or by including thallium, silver or sodium in the semiconductor composition. Normally, one would want to use a dopant that has a very low diffusion constant to insure that the pn junction 16c is not only abrupt as formed but remains so during use. Accordingly, in most instances, it is preferred to dope the various layers as formed rather than subsequently by diffusion.

In general, about 1-8 mole percent of ytterbium should be included in layers 14 and 18. At least about 1 mole percent ytterbium is needed in in order to obtain a sufficient increase in the band gap energy and reduction in index of refraction to produce a measurable increase in the carrier and optical confinement. On the other hand, if more than about 8% of ytterbium is used, it may be too difficult to dope the resultant semiconductor heavily p-type, and will at some point produce a lattice constant mismatch. Compositions over 8 mole percent have not been adequately investigated to know where that point is. I prefer to use at least about 1½-5 mole percent ytterbium in layers 14 and 18. The latter range in ytterbium concentration appears to provide extremely good lattice matching, a significant increase in band gap energy, a significant reduction in index of refraction, and susceptibility to relatively heavy p-type doping.

Analogously, the preferred range for tin in my lead-tin-ytterbium telluride composition is about 10–35 mole percent. It appears to be too difficult to dope the compositions heavily p-type with lower tin concentrations. It is difficult to grow high quality monocrystalline semiconductive material with tin concentrations greater than about 35 mole percent.

In summary, I believe that any lead chalcogenide semiconductor can be used to form a junction diode laser in accordance with this invention, by simply including ytterbium in buffer and confinement layers while maintaining the lead-tin ratio in those layers and the active region layer substantially constant.

It can be seen in the drawing that I elected to use a substrate containing 1 mole percent more tin in its composition than in the composition of the epitaxial layers. This provides only a slight lattice mismatch between the substrate and the epitaxial layers. Had I had a substrate of $Pb_{0.86}Sn_{0.14}Te$ available, I would have used it. I elected to use epitaxial layers containing 14 mole percent tin because that is what I had available at the time. On the other hand, I think even better results would have been obtained if I had used a substrate having 14 mole percent tin, instead of 15 mole percent tin.

Further, while I have described this invention in connection with a lead-tin telluride semiconductors, I believe it is also applicable to lead-tin selenide and lead-tin selenide-telluride semiconductors.

The embodiments of the invention in which an exclusive property or privilege is claimed are defined as follows:

1. In a double heterojunction semiconductor lead salt infrared diode laser, the improvement wherein a semiconductive monocrystalline lead salt active region layer of given energy band gap, index of refraction, crystal structure and lattice constant is sandwiched between two semiconductive monocrystalline lead-tin ytterbium salt layers of mutually opposite conductivity type and having an energy band gap significantly higher than, an index of refraction significantly lower than, a crystal structure the same as, and a lattice constant substantially equal to said active region layer, effective to increase layer performance by providing lattice matching among said layers as well as providing carrier and optical confinement with respect to said active region layer.

2. In a double heterojunction semiconductor long wavelength infrared diode layer exhibiting excellent current carrier and optical confinement in its active region layer but also exhibiting increased power due to close lattice matching of monocrystalline layers from the double heterojunctions, a monocrystalline buffer layer of a given conductivity type lead salt semiconductor containing ytterbium that has an energy band gap greater, an index of refraction lesser, and a lattice constant substantially equal to predetermined values, a monocrystalline active region layer on the buffer of a lead salt semiconductor containing a pn junction that has said predetermined energy band gap, index of refraction and lattice constant, and a confinement layer on said active region layer on an opposite conductivity type lead salt semiconductor containing ytterbium that has an energy band gap greater, an index of refraction smaller, and a lattice constant substantially equal to said predetermined value.

3. In a double heterojunction semiconductor long wavelength infrared diode laser, the improvement wherein a lead-tin telluride monocrystalline semiconductive active region layer of given energy band gap, index of refraction, and lattice constant is sandwiched between two lead-tin-ytterbium telluride monocrystalline semiconductor layers of mutually opposite conductivity type and having an energy band gap significantly higher than, an index of refraction significant lower than, and a lattice constant substantially equal to said active region layer, effective to increase laser performance by providing lattice matching among said layers as well as providing carrier and optical confinement to said active region layer.

4. In a double heterojunction semiconductor long wavelength infrared diode laser exhibiting excellent current carrier and optical confinement in its active layer but also exhibiting increased power due to close lattice matching of monocrystalline layers, a monocrystalline buffer layer of p-type conductivity lead-tin-ytterbium telluride semiconductor having about 10–35 mole percent tin and about 1-8 mole percent ytterbium, a monocrystalline active region layer on said buffer layer of a lead-tin-telluride semiconductor containing a pn junction for producing lasing action and containing substantially the same tin content as in said buffer layer, and a confinement layer on said active layer of an n-type lead-tin-ytterbium telluride semiconductor of substantially the same composition as in said buffer layer.

* * * * *